United States Patent [19]

Choi

[11] Patent Number: 5,772,700
[45] Date of Patent: Jun. 30, 1998

[54] LOCATION GUIDE BAR WHICH ACCOMMODATES MULTIPLE SIZE CASSETTES FOR USE IN A LOADER AND UNLOADER INDEXER

[75] Inventor: Myoung-Taek Choi, Kyonggi-do, Rep. of Korea

[73] Assignee: Samsung Electronics Co., Ltd., Suwon, Rep. of Korea

[21] Appl. No.: 885,797

[22] Filed: Jun. 30, 1997

[30] Foreign Application Priority Data

Oct. 14, 1996 [KR] Rep. of Korea ..................... 96-45712

[51] Int. Cl.$^6$ .......................... B65G 49/07; B65D 85/48; B05C 13/00; A47G 19/08
[52] U.S. Cl. ..................... 29/25.01; 118/500; 414/935; 206/454; 211/41.1
[58] Field of Search ........................... 118/500; 414/935; 206/454; 29/25.01; 211/41.1

[56] References Cited

U.S. PATENT DOCUMENTS 4,402,613  9/1983  Daly et al. .
4,776,744  10/1988  Stonestreet et al. .

FOREIGN PATENT DOCUMENTS 61-7641    1/1986  Japan .
61-101033  5/1986  Japan .

*Primary Examiner*—David Graybill
*Attorney, Agent, or Firm*—Jones & Volentine, L.L.P.

[57] ABSTRACT

A cassette location guide bar for a loader and unloader indexer includes a guide body having pairs of guide holes which allow different sized cassettes to be interchangeably installed in the loader and unloader indexer. The guide holes are formed in the body and positioned at distances which correspond to the distance between the legs of different sized cassettes. The guide bar is inserted into and fixed onto a slot of a platform of the loader and unloader indexer.

16 Claims, 5 Drawing Sheets

Fig. 1
(Prior Art)
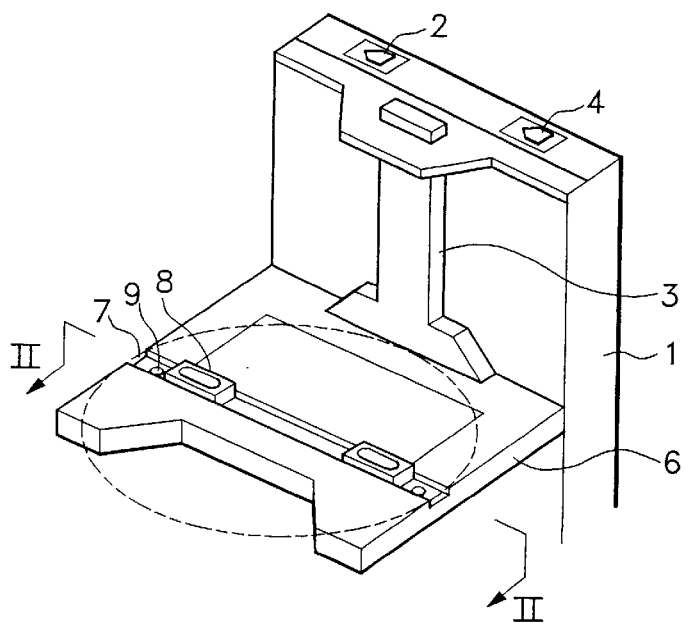
Fig. 2A
(Prior Art)
Fig. 2B
(Prior Art)
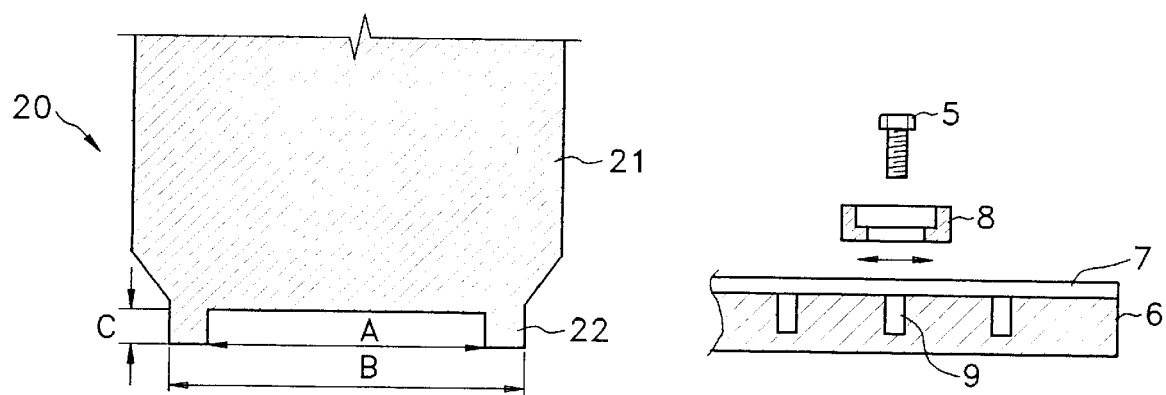

LOCATION GUIDE BAR WHICH ACCOMMODATES MULTIPLE SIZE CASSETTES FOR USE IN A LOADER AND UNLOADER INDEXER

BACKGROUND OF THE INVENTION

1. Field of the Invention

The present invention relates to an improved cassette location guide bar which accommodates multiple size cassettes for use in a loader/unloader indexer. More specifically, the present invention relates to a cassette location guide bar comprising guide holes which allow different sized cassettes to be easily and interchangeably installed in the loader/unloader indexer. Such interchangeability reduces set-up time for processing of wafers when cassettes with wafers are installed on a loader/unloader indexer for probing of the wafers by an EDS (Electrical Die Sorting) process as one of the final steps in semiconductor production.

2. Background of the Related Art

In conventional semiconductor production, wafers are passed through an etch process, a deposition process, an implantation process, etc., and must pass through quality control such as a wafer probing process before being diced and fabricated into chips. The wafer probing process is performed in a probe station having an extremely delicate probe. The probe is connected to the probe station utilizing a computer, and the probe tests electrical characteristics of the chips. Poor quality chips are marked with a black mark thereon, so as to be easily discriminated from good quality chips. The computer assists the probe station in probing each of the multiple chips on the wafer for a variety of complex electrical characteristics.

Wafer probing proceeds as follows. A plurality of wafers to be probed are contained in slots in the cassette, and the cassette is loaded on a loader indexer of the probe station. A transfer arm transfers the wafers one at a time from the bottom of the cassette onto a chuck. The chuck with the wafer thereon then moves horizontally and vertically until a probe card mounted on the center of a ring carrier comes into contact with the chips of the wafer, thereby allowing the chips to be probed. After passing through the probing test, the wafers are stored in an empty cassette on an unloader indexer. When the entire probing test is completed, all wafer cassettes on the loader indexer and the unloader indexer are removed.

In such a testing process, a cassette with wafers is loaded on a platform of the loader indexer. As shown in FIG. 1, the loader indexer 10 comprises a supporter 1, and a platform 6, which is spaced from the supporter 1 and moves up and down according to operation of a load switch 2 and a start switch 4. The load switch 2 functions to move the platform 6 and any cassette fixed thereto in an upward direction. The start switch 4 functions to move the platform 6 and cassette in a downward direction. A slot 7 is formed in the top surface of the platform 6 across the entire width of the platform 6. In the slot 7 are formed a plurality of nut holes 9. Locators 8 for positioning wafer cassettes on the platform 6 are fixed into the slot 7. Locators 8 have the same width as the slot 7, and are positioned in the slot 7 by set screws 5 and nut holes 9 as shown in FIG. 2B. A cassette with wafers is installed in position on platform 6 by fixing the position of the legs 22 of the cassette, as shown in FIG. 2A, with the locators 8. The platform 6 is moved up and down by a driving means (not shown), under the control of switches 2 and 4, thereby permitting the wafers in the cassette positioned on platform 6 to be moved into and out of the testing position. The loader indexer 10 further includes a slide bar 3 which guides movement of the platform 6. An unloader indexer having the same structure as the loader indexer 10 is operated in the same manner when the wafers are stored in the unloader indexer after the probing process.

The operation for loading a cassette with wafers on the platform 6 is described below in detail with reference to FIGS. 2A to 4.

Referring to FIG. 2A, a cassette 20 comprises a body 21 for loading wafers and two legs 22 for supporting the body 21. The body 21 and the two legs 22 may be modified to accommodate different sizes of wafers. The reference capital letters A, B and C in FIG. 2A represent the distance between the inner sides of the two legs 22, the distance between the outer sides of the two legs 22, and the height of the legs 22, respectively. Values for distances A, B and C according to sizes of wafers are given in Table 1.

TABLE 1

| Dimension(mm) ↓ | Wafer(inch) → | | |
| --- | --- | --- | --- |
| | 4 | 5 | 6 |
| A | 87.5 | 107.0 | 130.5 |
| B | 97.0 | 117.0 | 140.0 |
| C | 5.5 | 5.0 | 5.0 |

Positioning of a locator 8 into slot 7 is illustrated in FIG. 2B, which is an exploded sectional view of the locator 8, set screw 5, and a portion of platform 6. Usually two locators 8 are installed in the slot 7 of the platform 6. For simplicity, only one locator 8 of the two is illustrated. The locator 8 is movable horizontally back and forth along the slot 7. After the locator 8 is adjusted into position in the slot 7, a set screw 5 fastens the locator 8 on the platform 6 by turning into the nut hole 9. When two locators 8 are installed in slot 7 as shown in FIG. 1, the distance between outer sides of the two locators 8 is set to be the same as the distance A of FIG. 2A, or slightly smaller.

FIGS. 3A, 3B and 3C are a top view, a partial sectional view and a side view, respectively, of the locator 8. The locator 8 has a width 'h', a height 'g' and a length 'e'. The locator 8 has a positioning hole formed as a counterbored elongated oval. This positioning hole accommodates set screw 5, when locator 8 is positioned in slot 7. The positioning hole is formed in two sections: one is a first section 12 which has a depth 'f', a width 'b' and a length 'd'; and the other is a second section 14 which has a depth 'i', a width 'a', and a length 'c'. Since the first section 12 is larger than the second section 14, a boundary shoulder 13 is formed therebetween. Values for these dimensions for a locator 8 are given in Table 2.

TABLE 2

| Locator | |
| --- | --- |
| Width(h): 6.3 mm | |
| Height(g): 5.3 mm | |
| Length(e): 5.3 mm | |
| Positioning hole | |
| First section | Second section |
| Depth(f): 2.5 mm | Depth(i, g–f): 2.8 mm |
| Width(b): 4.0 mm | Width(a): 2.5 mm |
| Length(d): 16.9 mm | Length(c): 15.2 mm |

In order to accommodate the three different values for distance A as given in Table 1 and as shown in FIG. 2A, the two locators 8, 8 are adjusted along the slot 7. Two set screws 5, 5 are used to fasten the locators 8, 8 on the platform 6 by turning into the nut holes 9. At this time, the head of each set screw 5 is tightened down until it is tight against the boundary shoulder 13, whereby the locator 8 is tightly fixed on the platform 6.

When the two locators 8 have been completely fixed on the platform 6, a cassette 20 with a plurality of wafers 15 is fixed on the platform 6 by positioning the inner sides of the two legs 22 of the cassette 20 in contact with the outer sides of the two locators 8 respectively as shown in FIG. 4.

However, such a conventional locator has several problems. First, a large amount of manual set-up time is required to accurately install the locator to the platform. In addition, locator positions must be changed whenever the cassette size changes. A ruler or other measurement tool is required for an accurate installation. Furthermore, since only the inside of each leg of the cassette is in contact with the locator, the cassette may vibrate when it moves up and down in accordance with up and down movement of the platform. Wafers inside the cassette may become cracked due to vibration of the cassette.

SUMMARY OF THE INVENTION

It is therefore one object of the present invention to replace the locator with a location guide bar which interchangeably accommodates different sized wafer cassettes.

It is another object of the invention to provide a location guide bar which is capable of reducing the set-up time required to install wafer cassettes on a loader/unloader indexer.

It is a further object of the invention to provide a location guide bar which is capable of protecting wafers from cracking due to vibration of the cassette when the indexer platform moves up and down.

It is a feature of the invention that the location guide bar comprises guide holes corresponding to different sized cassettes to allow cassettes to be easily and interchangeably installed on indexers with minimum set-up time.

It is another feature of the invention that the location guide bar comprises a guide bar which is formed in a body with guide holes corresponding to different sized cassettes. Preferably, at least one positioning hole is formed in the guide bar, thereby the guide bar can be fixed to a platform.

BRIEF DESCRIPTION OF THE ATTACHED DRAWINGS

The accompanying drawings, which are included to provide a further understanding of the invention and are incorporated in and constitute a part of this specification, illustrate an embodiment of the invention, in which:

FIG. 1 is a perspective view of a conventional loader/unloader indexer;

FIG. 2A is a sectional view of a conventional wafer cassette;

FIG. 2B is an exploded sectional view of a conventional locator, set screw, and a portion of a platform of the loader/unloader indexer of FIG. 1, taken along the line II—II;

Figure 3A:
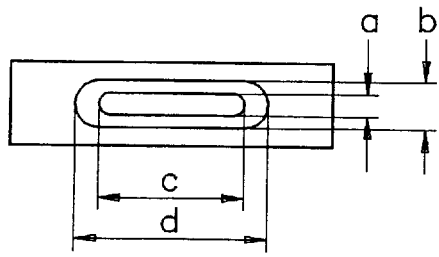
Figure 3B:
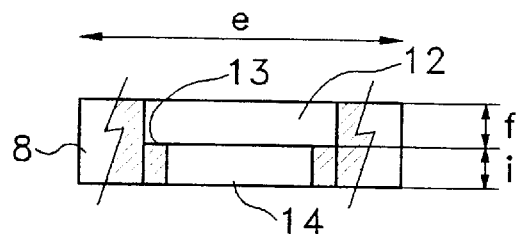
Figure 3C:
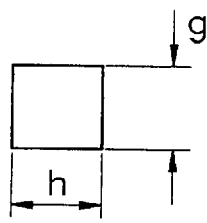
Figure 4:
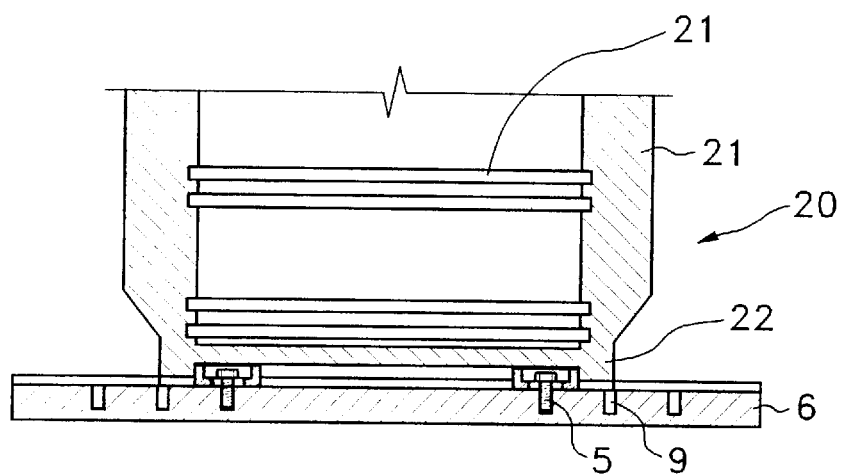
Figure 5A:
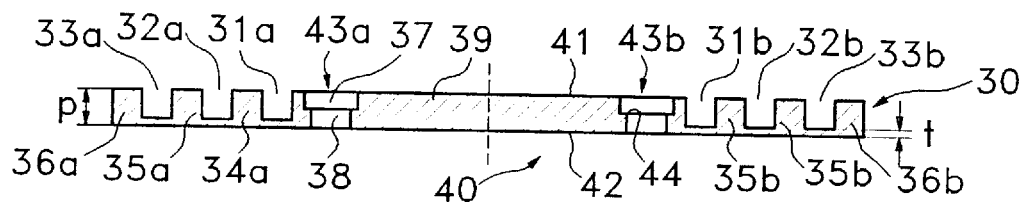
Figure 5B:
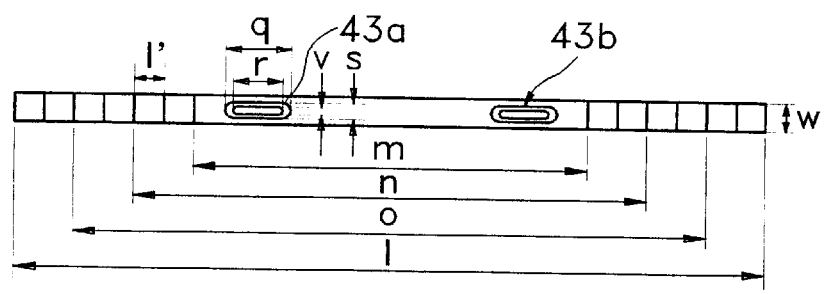
Figure 5C:
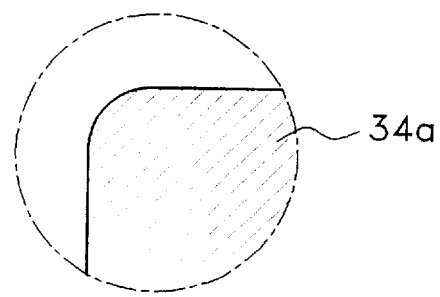
Figure 6:
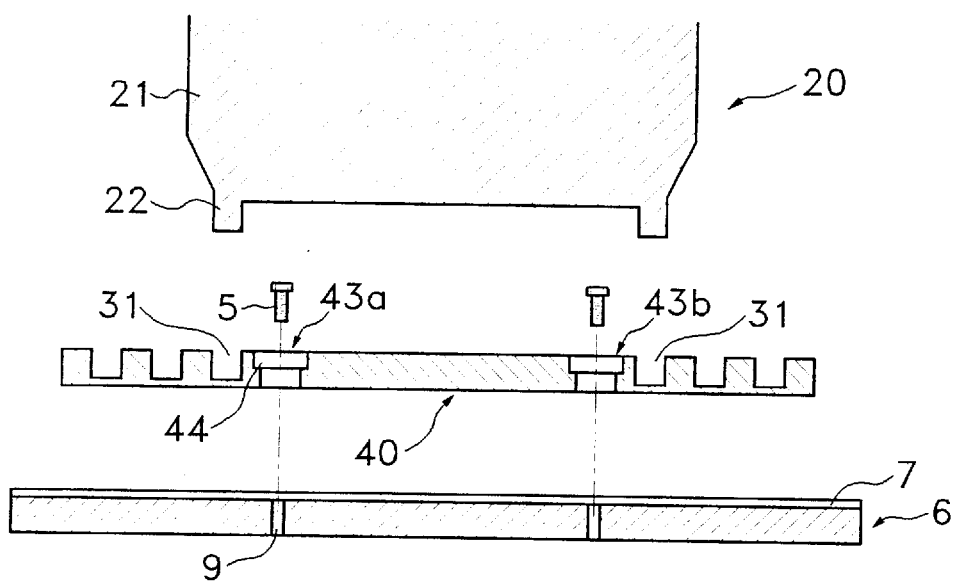
Figure 7:
Figure 8:
Figure 9:
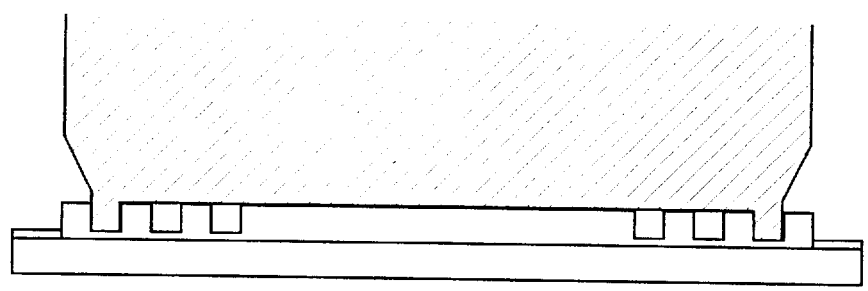
Figure 10:
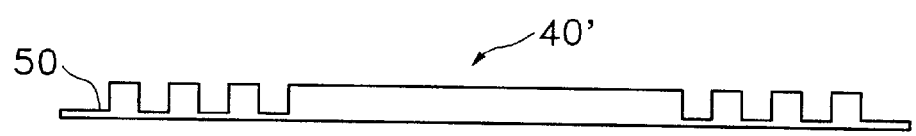

FIGS. 3A, 3B, and 3C are a top view, a partial sectional view, and a side view, respectively, of the conventional locator as shown in FIG. 2B;

FIG. 4 is a sectional view of the conventional cassette as shown in FIG. 2A fixed on the conventional loader/unloader indexer as shown in FIG. 1, using the conventional locator as shown in FIG. 2B;

FIG. 5A is a sectional view of a location guide bar according to an embodiment of the present invention;

FIG. 5B is a top view of the guide bar as shown in FIG. 5A;

FIG. 5C is an enlarged detail view of the top corner of one of the guide holes of the guide bar as shown in FIG. 5A;

FIG. 6 is an exploded sectional view of the conventional cassette as shown in FIG. 2A, fixed to the platform of a conventional loader/unloader indexer, using the guide bar as shown in FIG. 5A;

FIG. 7 is a partial sectional view of a cassette for 4" wafers fixed to the platform of a conventional loader/unloader indexer, using the guide bar as shown in FIG. 5A;

FIG. 8 is a partial sectional view of a cassette for 5" wafers fixed to the platform of a conventional loader/unloader indexer, using the guide bar as shown in FIG. 5A;

FIG. 9 is a partial sectional view of a cassette for 6" wafers fixed to the platform of a conventional loader/unloader indexer, using the guide bar as shown in FIG. 5A; and FIG. 10 is a side view of a location guide bar according to a second embodiment of the present invention.

DETAILED DESCRIPTION OF PREFERRED EMBODIMENT

An embodiment of the invention will now be described with reference to FIGS. 5A–9. As depicted in FIG. 5A, the present invention replaces the conventional locators 8 with a location guide bar for fixing wafer cassettes to the platform 6 of the loader/unloader indexer. The guide bar 40 comprises a body 39, having a top surface 41 and a bottom surface 42, and a first pair of guide holes 31*a*, 31*b*, a second pair of guide holes 32*a*, 32*b* and a third pair of guide holes 33*a*, 33*b* on the body 39. Each pair of guide holes 31*a* and b, 32*a* and *b*, and 33*a* and b is symmetrically disposed about a centerline of the body 39. Each guide hole has a depth 'p', and the thickness of the base of each guide hole (i.e., the distance between a bottom of each guide hole and the bottom surface 42 of the body 39) is designated 't' as shown in FIG. 5A.

Formation of the guide holes 31*a* and b, 32*a* and *b*, and 33*a* and *b* also forms projecting ribs 34*a* and *b*, 35*a* and *b* and 36*a* and *b*, respectively, as shown in FIG. 5A. The inner edges of the projecting ribs may preferably be rounded as shown in FIG. 5C, for easy insertion of the legs of the wafer cassette 20. Material for the guide bar may be aluminum. The guide bar may be hard anodized for protection from cracking and discoloring. The length of the guide holes 31*a* and *b*, 32*a* and *b*, and 33*a* and *b* is designated 1' in FIG. 5B, and is also selected to accommodate easy insertion of the legs of the wafer cassette. Therefore, length 1' is preferably a little larger than the width of the leg of the wafer cassette.

At least one positioning hole must be provided in the body 39 of the guide bar, similar to the holes 12,14 in the conventional locator 8. As shown in FIGS. 5A and 5B, the body 39 of the guide bar is provided with a pair of positioning holes 43*a* and *b* formed as counterbored elongated ovals. Each positioning hole 43*a* or *b* comprises two sections: section 37 which has a length 'q' and a width 's'; and section 38 which has a length 'r' and a width 'v'.

Since the first section 37 is larger than the second section 38, a boundary shoulder 44 is formed therebetween. As shown in FIG. 6, when set screws 5 are inserted through positioning holes 43*a* and *b* and into nut holes 9 in platform 6, shoulders 44 serve as backstops against which the heads of set screws 5 are tightened. In addition, the thickness 't' of the base of each guide hole is selected to be the same as the depth of the slot 7 formed on the platform 6. As a result, the bottom of the holes and the surface of the platform are flush when the guide bar has been installed in the slot. The thickness 't' of the base of each guide hole may also be a little smaller than the depth of the slot.

However, the thickness 't' should not exceed the depth of the slot, because such a configuration would cause the level of the bottoms of the holes to be higher than the surface of the platform, which may cause a cassette installed in the slot to shake. FIGS. 5A and 5B show the dimensions of the guide bar with corresponding reference letters. Preferred values for those dimensions are given in Table 3 below.

TABLE 3

Distance between the inner sides of
  First guide holes(m): 87 mm
  Second guide holes(n): 106.5 mm
  Third guide holes(o): 130 mm
Guide bar
  Width(w): 6 mm
  Height(p): 5 mm
  Length(l): 151 mm
Guide holes
  Length(1'): 5.5 mm
Positioning holes
  First section
    Length(q): 11 mm
    Width(s): 4.0 mm
  Second section
    Length(r): 8 mm
    Width(v): 2.5 mm A method for installing a wafer cassette 20 on the platform 6 of a loader/unloader indexer using the guide bar 40 will be described in detail below, with reference to FIG. 6.

First, the guide bar 40 is inserted into the slot 7 formed on the platform 6. By sliding back and forth, the position of the guide bar is adjusted to be in the center of the slot 7. In other words, the guide bar is located in the center of the slot 7 by making the space between the left end of the guide bar and the left end of the slot 7 equal to the space between the right end of the guide bar and the right end of the slot 7. Then a set screw 5 is inserted through positioning hole 43a or b and into a nut hole 9 to fix the guide bar to the slot 7. At this time, the head of the set screw 5 is tightened down until it is tight against the boundary shoulder 44, whereby the guide bar is fastened tightly to the platform. Two legs 22 of a cassette 20 with wafers to be probed are inserted into corresponding guide holes of the guide bar. The rounded edges of the projecting ribs of the guide bar as described above and shown in FIG. 5C allow the cassette to be more smoothly inserted.

The guide bar as shown in FIG. 5A is provided with three pairs of guide holes 31a and b, 32a and b and 33a and b, which permit the guide bar to accommodate three different sizes of wafer cassettes, as shown in FIGS. 7, 8 and 9. The three different sized cassettes are used to hold three different sizes of wafers (i.e., 4", 5" and 6" wafers). Dimensions of the legs of each size cassette are as shown in Table 1 above. Dimensions m, n and o for the three pairs of guide holes 31a and b, 32a and b, and 33a and b as shown in Table 3 above are selected in accordance with the leg dimensions of Table 1. In comparing the dimensions of Tables 1 and 3, it can be seen that the dimension A for each cassette is longer than the dimensions m, n and o, preferably by 0.5 mm. In addition, the length 1' of each guide hole is set at 5.5 mm, as shown in Table 3, which length is 0.5 mm larger than the width of each leg of the wafer cassettes. These dimensions 1', m, n and o are important in the structure of the guide bar, since they permit easy insertion of the cassettes into the guide bar.

In addition, the depth 'p' of each guide hole is smaller than the height C of each leg of the cassette, and the thickness 't' of the base of each guide hole is the same as the depth of the slot 7 in platform 6 of the loader/unloader indexer.

As described above, the guide bar 40 is installed into the slot 7 and must be centered in the slot by making the space between the left end of the guide bar and left end of the slot equal to the space between the right end of the guide bar and the right end of the slot. A second embodiment of the present invention is shown in FIG. 10, in which the right and left ends of the guide bar are provided with extension tabs 50. In this embodiment, the guide bar 40' with tabs 50 has a total length which is the same length as the slot. As a result, guide bar 40' does not need to be centered by equalizing the spaces between the left and right ends of the guide bar and slot as described above. The extension tabs 50 on both ends of the guide bar 40' make it possible to install the guide bar faster and more easily, by simply aligning the free end of one of the extension tabs 50 with the corresponding edge of the slot 7.

Once the guide bar of the present invention has been installed, no additional set-up is required, even when switching from one size cassette to another. Therefore it is possible to reduce installation time. Furthermore, the pre-formed guide holes allow different sized cassettes to be accurately installed. When a cassette is installed in the guide bar, the two sides of the legs of the cassette are supported by the projecting ribs which form the two sides of the guide holes. As a result, the cassette is more securely held onto the platform, and the wafers are protected from damage due to vibration of the cassette during up and down movement of the platform.

In the two embodiments of the present invention detailed above, the guide bar, projecting ribs and extension tabs (if any) are formed as an integral unit. However, the guide holes may be formed by using separate elements as the body 39 and the projecting ribs 34a and b, 35a and b, and 36a and b. These separate elements would have to be inserted into the slot and fixed separately. Such an embodiment of the guide bar of the present invention would operate in the same manner as the embodiments described above. However, in this embodiment, the dimensions of the separate elements of the guide bar must be accurately controlled, and installation would be more complicated and time-consuming.

While preferred embodiments of the present invention have been described, it will be understood by those skilled in the art that various changes and modifications may be made, and equivalents may be substituted for elements thereof without departing from the true scope of the present invention. Therefore, it is intended that the present invention not be limited to the particular embodiment disclosed, but that the present invention include all embodiments falling within the scope of the appended claims.

What is claimed is:

1. A location guide bar for a loader and unloader indexer having a supporter and a platform spaced from the supporter and moving up and down with guidance of a slide bar, comprising:

a body which is inserted into a slot in the platform; and guide holes formed in the body, said guide holes positioned in the body at distances corresponding to distances between legs of different sized wafer cassettes.

2. The location guide bar of claim 1, wherein the guide holes are formed on the body symmetrically about a centerline of the body.

3. The location guide bar of claim 2, wherein the guide holes comprise:

a first pair of guide holes for installing a cassette with 4" wafers;

a second pair of guide holes for installing a cassette with 5" wafers; and a third pair of guide holes for installing a cassette with 6" wafers.

4. The location guide bar of claim 3, further comprising a positioning hole formed in the body between the centerline of the body and one of the first pair of guide holes.

5. The location guide bar of claim 4, further comprising an additional positioning hole.

6. The location guide bar of claim 4, wherein the positioning hole comprises:

a first section with a first length and a first width; and a second section with a second length and a second width, the first section and the second section comprising a counterbored elongated oval with a boundary shoulder formed at an interface between the first and second sections.

7. The location guide bar of claim 1, wherein a thickness of a base of each guide hole in the guide bar is the same as a depth of the slot in the platform.

8. The location guide bar of claim 1, wherein a length of each guide hole is longer than a width of the leg of the cassette.

9. The location guide bar of claim 8, wherein the length of each guide hole is longer than the width of the leg of the cassette by 0.5 mm.

10. The location guide bar of claim 3, wherein distances between inner sides of the first pair of guide holes, the second pair of guide holes, and the third pair of guide holes are larger than distances between inner sides of the two legs of cassettes with 4", 5" and 6" wafers, respectively.

11. The location guide bar of claim 3, wherein distances between the inner sides of the first pair of guide holes, the second pair of guide holes, and the third pair of guide holes are larger than distances between inner sides of the two legs of the cassettes with 4", 5" and 6" wafers, respectively, by 0.5 mm.

12. The location guide bar of claim 1, wherein inner edges of projecting ribs formed between adjacent guide holes are rounded.

13. The location guide bar of claim 12, wherein material of the guide bar comprises aluminum.

14. The location guide bar of claim 12, further comprising extension tabs formed at free ends of the body beyond the last projecting rib on each end, such that a total length of the guide bar equals a length of the slot in the platform.

15. The location guide bar of claim 1, wherein said body is formed as a single unit and each of said guide holes is formed from a separate piece of material, as a separate element, which is not integral with the body.

16. A loader and unloader indexer which comprises:

a supporter;

a platform spaced from the supporter and moving up and down with guidance of a slide bar; and a locator for installing a plurality of different sized cassettes, each containing a plurality of wafers, onto the platform, said locator inserted into a slot of the platform, said locator including a guide bar comprising:

a body; and guide holes formed in the body, said guide holes being positioned in the body at distances corresponding to distances between the legs of the different sized cassettes, said guide holes formed on the body symmetrically about a centerline of the body, said guide holes comprising:

a first pair of guide holes for installing a cassette with 4" wafers;

a second pair of guide holes for installing a cassette with 5" wafers; and a third pair of guide holes for installing a cassette with 6" wafers, said guide bar further comprising:

a positioning hole formed in the body between the centerline of the body and one of the first pair of guide holes, wherein:

a thickness of a base of each guide hole in the guide bar is the same as a depth of the slot in the platform, and a length of each guide hole is longer than a width of a leg of the cassette; and distances between inner sides of the first pair of guide holes, the second pair of guide holes, and the third pair of guide holes are larger than distances between inner sides of the two legs of cassettes with 4", 5" and 6" wafers, respectively.

* * * * *